United States Patent
Aiken et al.

(10) Patent No.: US 9,490,033 B2
(45) Date of Patent: Nov. 8, 2016

(54) AUTO-BLOW MEMORY REPAIR

(71) Applicant: Cavium, Inc., San Jose, CA (US)

(72) Inventors: Steven W. Aiken, Pepperell, MA (US);
David A. Carlson, Haslet, TX (US)

(73) Assignee: Cavium, Inc., San Jose, CA (US)

( * ) Notice: Subject to any disclaimer, the term of this patent is extended or adjusted under 35 U.S.C. 154(b) by 97 days.

(21) Appl. No.: 14/039,846

(22) Filed: Sep. 27, 2013

(65) Prior Publication Data

US 2015/0095732 A1 Apr. 2, 2015

(51) Int. Cl.
*G11C 29/00* (2006.01)
*G11C 29/44* (2006.01)
*G11C 29/04* (2006.01)

(52) U.S. Cl.
CPC ......... *G11C 29/4401* (2013.01); *G11C 29/785* (2013.01); *G11C 2029/0405* (2013.01)

(58) Field of Classification Search
CPC ... G11C 17/16; G11C 29/4401; G11C 17/18; G11C 2029/4402; G11C 29/785; G11C 29/027; G11C 2029/0409; G11C 29/14; G11C 29/846; G11C 29/808; G11C 29/802; G11C 2229/726; H03M 7/30; H03K 19/018557; H03K 19/018592; H03K 19/018585
See application file for complete search history.

(56) References Cited

U.S. PATENT DOCUMENTS

| | | | | |
|---|---|---|---|---|
| 5,987,632 A | * | 11/1999 | Irrinki et al. | 714/711 |
| 6,408,401 B1 | * | 6/2002 | Bhavsar et al. | 714/6.2 |
| 6,768,694 B2 | * | 7/2004 | Anand et al. | 365/225.7 |
| 6,966,012 B1 | * | 11/2005 | Gandhi | 714/6.32 |
| 7,076,699 B1 | * | 7/2006 | Puri et al. | 714/710 |
| 7,350,119 B1 | * | 3/2008 | Zuraski et al. | 714/711 |
| 2003/0237033 A1 | * | 12/2003 | Borri et al. | 714/718 |
| 2004/0015754 A1 | * | 1/2004 | Callaway et al. | 714/719 |
| 2004/0136257 A1 | * | 7/2004 | Nelson et al. | 365/225.7 |
| 2006/0083085 A1 | * | 4/2006 | Ikegami | 365/200 |
| 2006/0161803 A1 | * | 7/2006 | Andreev et al. | 714/5 |
| 2007/0104000 A1 | * | 5/2007 | Lin et al. | 365/200 |
| 2008/0065929 A1 | * | 3/2008 | Nadeau-Dostie et al. | 714/5 |
| 2009/0190422 A1 | * | 7/2009 | Khoja et al. | 365/200 |
| 2009/0251978 A1 | * | 10/2009 | Gorman et al. | 365/200 |
| 2013/0031319 A1 | * | 1/2013 | Gorman et al. | 711/157 |
| 2014/0189450 A1 | * | 7/2014 | Varadarajan et al. | 714/718 |
| 2015/0012786 A1 | * | 1/2015 | Varadarajan et al. | 714/718 |

OTHER PUBLICATIONS

Li, Jin-Fu, "Memory Built-In Self-Repair," *EE 6083 Semiconductor Memory Testing(Chapter 7)*, [online]2008 [retrieved on Sep. 30, 2013]. retrieved from the Internet URL: http://www.ee.ncu.edu.tw/~jfli/memtest/lecture/ch07.pdf, Advanced Reliable Systems (ARES) Lab., EE. NCU.

* cited by examiner

*Primary Examiner* — Guerrier Merant
(74) *Attorney, Agent, or Firm* — Hamilton, Brook, Smith & Reynolds, P.C.

(57) ABSTRACT

In an example embodiment, a method may include collecting, at a controller within an integrated circuit, defect information indicative of defects identified during a built-in self-test (BIST) operation performed on plural memories embedded within the integrated circuit. Fuses within the integrated circuit may be blown based on the defect information collected automatically and without software intervention. The fuses blown may be used to inform a built-in self-repair (BISR) operation performed on the plural memories.

20 Claims, 2 Drawing Sheets

AUTO-BLOW MEMORY REPAIR

BACKGROUND

Built-in self-test (BIST) functionality is incorporated into the design of integrated circuits to help simplify device characterization. BIST can help reduce manufacturing test time by allowing automated testing of portions of the integrated circuit device.

Built-in self-repair (BISR) functionality is generally a mechanism incorporated into the integrated circuit device that uses BIST results to automatically repair memory blocks on the device.

Electronic fuses (eFuses) are used to configure elements on an integrated circuit device after the silicon masking and fabrication process. Multiple eFuses are often used to repair silicon manufacturing defects and increase manufacturing yield.

SUMMARY

As chip density increases and process technology becomes smaller, memory defects become more common and numerous. An automated method of detecting and storing repair values helps to increase yield and reduces costly automated test equipment (ATE) test time.

In an example embodiment, a method may include collecting, at a controller within an integrated circuit, defect information indicative of defects identified during a built-in self-test (BIST) operation performed on plural memories embedded within the integrated circuit. Fuses within the integrated circuit may be blown based on the defect information collected automatically and without software intervention. The fuses blown may be used to inform a built-in self-repair (BISR) operation performed on the plural memories.

The collecting of the defect information may include sending a defect request from the controller to at least one memory of the plural memories. A memory receiving the defect request may update the defect information based on any defects identified during the BIST operation performed thereon and forward the defect request with the updated defect information to the controller.

In another embodiment, a method may include loading repair values from a register file into BISR logic of memory embedded within an integrated circuit; collecting, at a controller within the integrated circuit, defects identified based on a first BIST operation associated with the memory; updating the register file by storing the defects collected as repair values; and blowing repair fuses of an eFuse macro within the integrated circuit based on the repair values updated in the register file.

Repair values may be loaded into the register file from the eFuse macro prior to repairs values being loaded from the register file into the BISR logic.

The steps of loading repair values into the BISR logic, collecting defects identified, and updating the register file by storing the defects collected as repair values, may be performed for a second BIST operation or subsequent BIST operations prior to blowing repair fuses based on repair values updated in the register file The memory may comprise plural memory blocks and loading the repair values from the register file into BISR logic may include sending the repair values to the plural memory blocks over a series chain connecting the plural memory blocks.

In further embodiments, an apparatus on an integrated circuit may include a BISR controller configured to collect defect information indicative of defects identified during a BIST operation performed on plural memories embedded within the integrated circuit. A fuse controller may be configured to blow fuses of an eFuse macro based on the defect information collected without software intervention. The BISR controller may be further configured to use the fuses blown to inform a BISR operation performed on the plural memories.

The BISR controller may collect the defects by sending a defect request to at least one memory of the plural memories. A memory receiving the defect request may update the defect information based on any defects identified during the BIST operation performed thereon and forward the defect request with the updated defect information to the BISR controller.

In another embodiment, an apparatus on an integrated circuit may include a BISR controller configured to collect defects identified based on a first BIST operation associated with memory embedded within the integrated circuit and to update a register file by storing the defects collected as repair values. A fuse controller may be configured to blow repair fuses within an eFuse macro based on the repair values updated in the register file.

The fuse controller may be further configured to load repair values into the register file from the fuse macro. The BISR controller may be further configured to load repair values from the register file into BISR logic of the memory. The BISR logic may be configured to perform a BISR operation on the memory based on the repair values loaded. The fuse controller blows the repair fuses without software intervention.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION

A description of example embodiments of the invention follows.

The result of a built-in self-test (BIST) operation is a set of vectors or values that define defective memory columns or rows. These vectors may be blown into a device's eFuse macro to permanently register bad locations for use in built-in self-repair (BISR). The blowing of repair fuses is usually performed by software on an external tester that is part of an ATE configuration. According to the principles of the present invention, the process of blowing repair fuses is automated in hardware on the integrated circuit device, without software intervention, resulting in reduced ATE time and expense.

Figure 1:
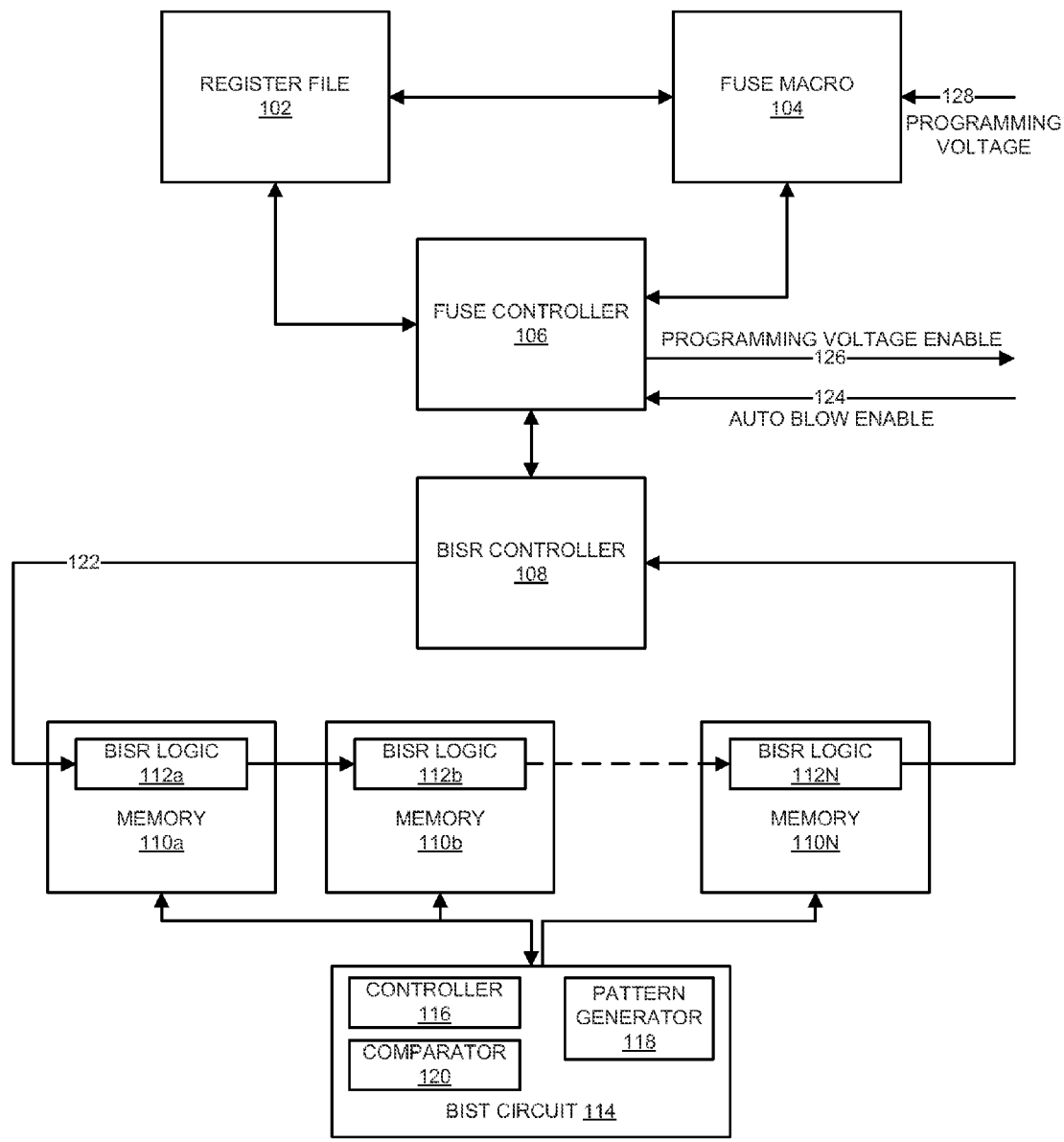
FIG. 1 is a block diagram of an example embodiment of a test and repair circuit on an integrated circuit device.

FIG. 1 illustrates an example embodiment of test and repair circuitry on an integrated circuit device. The test and repair circuitry operates to test and repair memory blocks 110a, 110b, . . . , 110N. The test portion includes a BIST circuit 114. The repair portion of the circuitry includes register file 102, fuse macro 104, fuse controller 106, BISR controller 108 and BISR logic 112a, 112b, . . . , 112N embedded in the corresponding memory blocks 110a, 110b, . . . , 110N.

The register file 102, fuse macro 104, and fuse controller 106 are coupled to each other. The BISR controller 108 communicates with the fuse controller 106 to access the register file 102. The BISR controller 108 also is coupled to the memory blocks 110 through a serial shift chain 122. It should be understood to one skilled in the art that the memory blocks in other embodiments can be configured to be directly coupled to the BISR controller 108 rather than through a serial shift chain.

The BIST functionality is controlled by BIST circuit 114 which in the example shown controls testing of the memory blocks 110. It should be understood to those skilled in the art that BIST circuit 114 can be configured to test other portions of the integrated circuit device not shown, or other BIST functionality can be incorporated to test those other portions.

The BIST circuit 114 provides conventional BIST functionality that includes a test controller 116, a test pattern generator 118 to produce data patterns, and a comparator 120 to check the memory output against the expected correct data pattern.

The memory blocks 110 are any form of memory array such as static random access memory (SRAM), dynamic random access memory (DRAM), or flash memory. The memory blocks are configured to include a main memory array and redundant memory. The redundant memory may be in the form of one or more spare columns, one or more spare rows, or both.

The BISR logic 112 is embedded into each memory block 110. The function of the BISR logic 112 is to reconfigure the memory block 110 to add redundant resources upon detection of a memory defect as a result of the BIST operation. As noted above, the redundancies take the form of one or more spare columns, one or more spare rows, or both. It should be understood to those skilled in the art that, rather than having dedicated BISR logic per memory block, other embodiments may use a shared BISR mechanism in which multiple memory blocks share BISR logic.

The fuse macro 104 is implemented as an eFuse macro. The eFuse macro is a form of one-time programmable memory and includes a plurality of eFuses that are programmed or "blown" in a manner typical for integrated circuit devices. That is, the eFuses are blown by applying a relatively large amount of power (e.g., a current with sufficient magnitude and duration) to the fuse to be programmed, so as to melt and separate the fuse material. This changes the resistance of the eFuse from a low pre-blown resistance to a high post-blown resistance. The resistance state of the eFuse is sensed to determine whether or not the eFuse is blown, i.e., the eFuse is a blown fuse (programmed) or a natural fuse (un-programmed).

The size of the eFuse macro may be selected based on the number and size of the memory blocks 110. In the context of BISR, the eFuses are used to permanently store an indication of the defects detected in the BIST operation of the memory blocks 110.

The register file 102 may be configured as a flopped register array. The register file 102 stores information associated with defects detected during a BIST operation. The defects detected are stored as repair values in the register file. In an embodiment in which the memory blocks 110 employ spare columns for use by the BISR logic 112 to effect repair, each repair value identifies a defective column in one of the memory blocks 110. In other embodiments in which the memory blocks employ spare rows for use by the BISR logic to effect a repair, each repair value identifies a defective row in one of the memory blocks 110.

In operation, the BISR controller 108 is configured to collect BIST faults from the memory blocks 110 at different voltage and temperature corners. Upon power up of the integrated circuit device, fuse controller 106 causes repair values to be read from eFuses in the fuse macro 104 into the register file 102. Note that, prior to any BIST operations, initially there are no repairs. The repair values are loaded from the register file under control of the BISR controller 108 through a BISR shift chain 122 into the BISR logic 112 of each memory block 110. After the particular BIST operation completes, any new defects identified by the BIST operation are sent through the shift chain 122 back to the BISR controller which causes the defects identified to be stored in the register file. The newly identified defects are appended as repair values to the repair values previously stored in the register file from the read of the eFuses of the eFuse macro. At this point several things can happen. If auto-blow enable 124 is asserted, the new repairs stored in the register file can be blown into the eFuse macro. The fuse controller 106 asserts programming voltage enable 126 that may be connected to an external programming current supply which in turn provides a programming voltage 128 to the fuse macro 104. Alternatively, a warm reset can be applied to the integrated circuit device which causes the BISR controller to shift all the repairs, both new and old, from the register file to the memory blocks for a next BIST operation at a new voltage and/or temperature corner. In addition, the register file 102 can be read out at any time by software and the repair values stored off-chip.

As shown in FIG. 1, the memory blocks 110 are connected to each other and the BISR controller 108 via a single serial configuration according to which the BISR controller sends a repair packet to one of the memory blocks, e.g., 110a. According to an example aspect, the repair packet includes an indication of the repair operation and a payload that includes one or more repair values as read from the register file 102. The BISR logic 112a of the first memory block 110a receives the repair packet from the BISR controller 108 and incorporates any repair value corresponding to that memory block into the BISR logic 112a for effecting any self-repair using redundant resources (rows or columns) of the memory block. In an embodiment, the repair packet is only processed once, by one of the memory blocks because each repair packet uniquely identifies one memory column. Once processed, the repair packet is simply passed through the remaining memory blocks of the chain.

According to another example aspect, the BISR controller 108 sends a defect request packet to one of the memory blocks, e.g., 110a. The defect request packet includes an indication of the read request operation and a payload. The BISR logic 112a of the first memory block 110a receives the defect request packet from the BISR controller 108 and incorporates any defects identified in a BIST operation completed on that memory block into the payload. Once the BISR logic 112a fills the defect request packet with its defect identifier, subsequent memory blocks pass it through the chain to the BISR controller 108. Likewise, the BISR logic of each of the other memory blocks processes other defect request packets.

Figure 2:
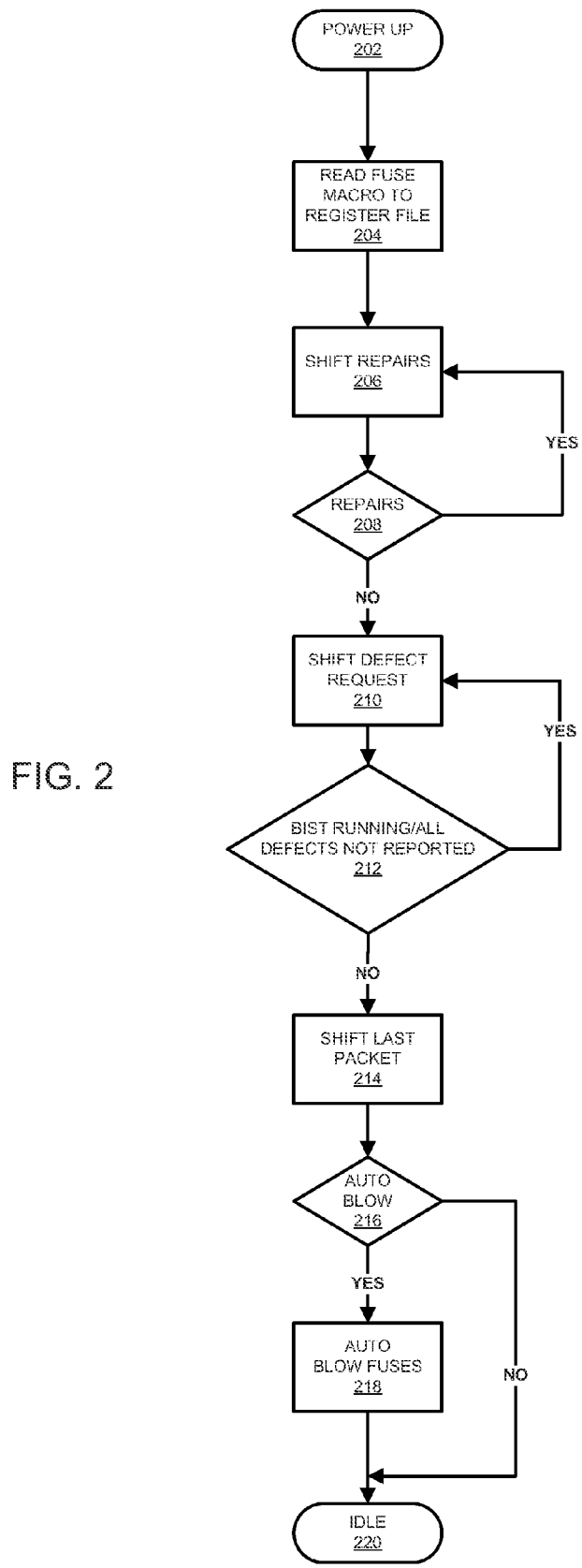
FIG. 2 is a flow diagram of an example control flow for the circuit of FIG. 1.

Referring now to FIG. 2, a flow diagram of an example control flow is shown for the circuit of FIG. 1. Upon power up of the integrated circuit device at 202, at 204 the eFuse macro 104 is read to the register file 102. The BISR controller 108 causes repair values to be shifted out from the register file to the memory blocks 110 around the shift chain 122 at 206. If there are no more repairs at 208, then the BISR controller 108 initiates a shift defect request to the memory blocks 110 around the shift chain 122. Otherwise, while repairs exist at 208, the shift continues at 206.

When the BIST operation completes at 212, a last defect request packet is shifted from the memory blocks at 214 to the BISR controller 108 which causes the defects identified to be stored in the register file. Each defect is sent from the BISR controller 108 to the fuse controller 106 as it comes off the shift chain 122. The fuse controller 106 stores the defects in the register file 102 as they are received. At 218, if auto blow is enabled, the fuse controller 106 causes the eFuses to be blown. Otherwise, the process stops at 220. The process may begin again for one or more additional BIST operations.

The BIST and BISR phases occur while logic reset is being applied, so the programming voltage output enable pin 126 is driven by the autoblow logic of the fuse controller 106 to enable the eFuse programming voltage pin 128 to be driven during programming. This allows for the entire process to complete without ATE software intervention. Additionally, software can be allowed to enable blowing of the eFuses from the register file in a single write without the software handling actual repair vectors.

While this invention has been particularly shown and described with references to example embodiments thereof, it will be understood by those skilled in the art that various changes in form and details may be made therein without departing from the scope of the invention encompassed by the appended claims.

What is claimed is:

1. A method comprising:
during a logic reset of an integrated circuit, collecting, at a built-in self-repair (BISR) controller within the integrated circuit, defect information indicative of defects identified during a built-in self-test (BIST) operation performed on plural memories embedded within the integrated circuit, wherein the collecting the defect information is automated in hardware on the integrated circuit and the collecting includes sending a defect request from the BISR controller to at least one memory of the plural memories;
during the logic reset, blowing, by a fuse controller within the integrated circuit, one or more fuses within the integrated circuit based on the defect information collected, wherein the blowing the one or more fuses by the fuse controller is initiated and automated in hardware on the integrated circuit;
during the logic reset, using, by the BISR controller, one or more fuses blown to inform a built-in self-repair (BISR) operation performed on the plural memories by BISR logic, each of the plural memories having BISR logic embedded within.

2. The method of claim 1 wherein logic associated with the at least one memory of the plural memories receiving the defect request updates the defect information based on any defects identified during the BIST operation performed thereon and forwards the defect request with the updated defect information to the controller.

3. A method comprising:
a) during a logic reset of an integrated circuit, loading repair values from a register file into built-in self-repair (BISR) logic of memory embedded within the integrated circuit, the BISR logic embedded within the memory;

b) during the logic reset, collecting, at a built-in self-repair (BISR) controller within the integrated circuit, defects identified based on a first built-in self-test (BIST) operation associated with the memory, wherein the collecting the defect information is automated in hardware on the integrated circuit and the collecting includes sending a defect request from the BISR controller to the memory;

c) during the logic reset, updating the register file by storing the defects collected as repair values;

d) during the logic reset, blowing repair fuses of an eFuse macro within the integrated circuit based on the repair values updated in the register file, wherein the blowing of the repair fuses is initiated and automated in hardware on the integrated circuit.

4. The method of claim 3 further comprising:
loading repair values into the register file from the eFuse macro prior to step (a).

5. The method of claim 3 further comprising:
performing steps (a), (b), and (c) for a second BIST operation associated with the memory prior to step (d).

6. The method of claim 3 further comprising:
iteratively performing steps (a), (b), and (c) for successive BIST operations associated with the memory prior to step (d).

7. The method of claim 3 wherein the memory comprises plural memory blocks and loading the repair values from the register file into BISR logic includes sending the repair values to the plural memory blocks over a series chain connecting the plural memory blocks.

8. An apparatus, on an integrated circuit, the apparatus comprising:
a built-in self-repair (BISR) controller configured, during a logic reset of the integrated circuit, to collect defect information indicative of defects identified during a built-in self-test (BIST) operation performed on plural memories embedded within the integrated circuit, the BISR controller being further configured to collect the defect information in an automated manner in hardware on the integrated circuit including sending a defect request from the BISR controller to at least one memory of the plural memories;
a fuse controller configured, during the logic reset, to blow fuses of an eFuse macro based on the defect information collected without software intervention, wherein the blowing the fuses by the fuse controller is initiated and automated in hardware on the integrated circuit;
the BISR controller further configured, during the logic reset, to use the fuses blown to inform a BISR operation performed on the plural memories by BISR logic, each of the plural memories having BISR logic embedded within.

9. The apparatus of claim 8 wherein a memory of the plural memories receiving the defect request updates the defect information based on any defects identified during the BIST operation performed thereon and forwards the defect request with the updated defect information to the BISR controller.

10. An apparatus, on an integrated circuit, the apparatus comprising:
during a logic reset of the integrated circuit, a built-in self-repair (BISR) controller configured, during a logic reset of the integrated circuit, to collect defects identified based on a first built-in self-test (BIST) operation associated with memory embedded within the integrated circuit including sending a defect request from the BISR controller to the memory, the BISR controller automated in hardware on the integrated circuit and the BISR controller further configured to inform a BISR operation performed by BISR logic, the BISR logic embedded within the memory, and configured to update a register file by storing the defects collected as repair values; and during the logic reset, a fuse controller configured to blow repair fuses within an eFuse macro based on the repair values updated in the register file; wherein the fuse controller is initiated, without software intervention, to blow the fuses and the fuse controller further blows the fuses without software intervention.

11. The apparatus of claim 10 wherein the fuse controller is further configured to load repair values into the register file from the fuse macro, the BISR controller is further configured to load repair values from the register file into BISR logic of the memory and wherein the BISR logic is configured to perform a BISR operation on the memory based on the repair values loaded.

12. The apparatus of claim 10 wherein the memory comprises plural memory blocks and loading the repair values from the register file into BISR logic includes sending the repair values to the plural memory blocks over a series chain connecting the plural memory blocks.

13. An apparatus, on an integrated circuit, the apparatus comprising:

during a logic reset of an integrated circuit, means for collecting, at a built-in self-repair (BISR) controller within an integrated circuit, defect information indicative of defects identified during a built-in self-test (BIST) operation performed on plural memories embedded within the integrated circuit, wherein the means for collecting is automated in hardware on the integrated circuit and includes means for sending a defect request from the controller to at least one memory of the plural memories;

during the logic reset, means for blowing one or more fuses within the integrated circuit based on the defect information collected, wherein the blowing the one or more fuses by the fuse controller is initiated and automated in hardware on the integrated circuit;

during the logic reset, means for using, by the BISR controller, one or more fuses blown to inform a built-in self-repair (BISR) operation performed on the plural memories by BISR logic, each of the plural memories having BISR logic embedded within.

14. The apparatus of claim 13 wherein logic associated with a memory of the plural memories receiving the defect request updates the defect information based on any defects identified during the BIST operation performed thereon and forwards the defect request with the updated defect information to the controller.

15. The method of claim 1, further comprising collecting the defect information at different voltage and temperature corners of the integrated circuit.

16. The method of claim 1, wherein the collecting is further initiated based upon a power up of the integrated circuit.

17. The method of claim 1, wherein the collecting is further initiated based upon a warm reset of the integrated circuit.

18. The method of claim 1, wherein the blowing the one or more fuses by the fuse controller is further initiated based upon a setting of a hardware enable signal of the integrated circuit.

19. The method of claim 1, wherein the blowing the one or more fuses by the fuse controller is further initiated based upon the controller asserting a programming voltage enable signal of the integrated circuit.

20. The method of claim 1, wherein the logic reset includes a hardware reset of the integrated circuit.

* * * * *